US006667236B2

United States Patent
Meijer et al.

(10) Patent No.: US 6,667,236 B2
(45) Date of Patent: Dec. 23, 2003

(54) METHOD OF MANUFACTURING A TWO LAYER LINER FOR DUAL DAMASCENE VIAS

(75) Inventors: Petrus Maria Meijer, Eindhoven (NL); Cornelis Adrianus Henricus Antonius Mutsaers, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/462,845

(22) Filed: Jun. 16, 2003

(65) Prior Publication Data

US 2003/0211737 A1 Nov. 13, 2003

Related U.S. Application Data

(62) Division of application No. 09/811,638, filed on Mar. 19, 2001, now Pat. No. 6,613,668.

(30) Foreign Application Priority Data

Mar. 20, 2000 (EP) ............................................. 00201006

(51) Int. Cl.[7] .......................................... H01L 21/4763

(52) U.S. Cl. ....................... 438/685; 257/774; 438/637; 438/639

(58) Field of Search ........................... 257/774; 438/637, 438/639, 685

(56) References Cited

U.S. PATENT DOCUMENTS

| 5,904,565 | A | * | 5/1999 | Nguyen et al. | ............. | 438/687 |
|---|---|---|---|---|---|---|
| 6,025,264 | A | * | 2/2000 | Yew et al. | .................. | 438/627 |
| 6,245,662 | B1 | * | 6/2001 | Naik et al. | .................. | 438/622 |
| 6,291,333 | B1 | * | 9/2001 | Lou | ........................... | 438/618 |
| 6,613,668 | B2 | * | 9/2003 | Meijer et al. | ............... | 438/639 |

FOREIGN PATENT DOCUMENTS

JP      102846000 A    * 10/1993

* cited by examiner

Primary Examiner—Michael S. Lebentritt
Assistant Examiner—Christian D. Wilson
(74) Attorney, Agent, or Firm—Aaron Waxler

(57) ABSTRACT

The invention relates to a semiconductor device comprising a substrate (1) comprising for instance silicon with thereon a layer (2, 4) comprising at least organic material which contains a passage (6, 8) to the substrate (1). The passage (6,8) has walls (7, 9) transverse to the layer (2, 4). A metal layer (11) is applied on the substrate (1) in at least that portion which adjoins the passage (8). The organic material forming the walls (7, 9) of the passage (6, 8) is covered with an oxide liner (12), and the passage (6, 8) is filled with a metal (14). According to the invention, a metal liner (13) comprising Ti or Ta is provided between the oxide liner (12) and the metal (14) filling the passage (6, 8). It is achieved by this that the device has a better barrier between the organic material (2, 4) and the interconnection metal (14) and that the organic material (2, 4) has a better protection during the various steps of the process.

4 Claims, 2 Drawing Sheets

METHOD OF MANUFACTURING A TWO LAYER LINER FOR DUAL DAMASCENE VIAS

CROSS REFERENCE TO RELATED APPLICATIONS

Figure 1:
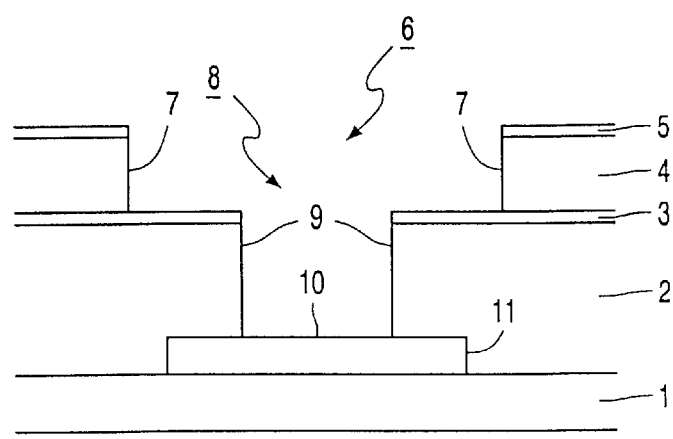

This is a divisional of application Ser. No. 09/811,638 filed Mar. 19, 2001 now U.S. Pat. No. 6,613,668.

The invention relates to a semiconductor device comprising a substrate which comprises silicon, with a layer thereon comprising at least organic material, in which layer a passage is present to the substrate having walls transverse to said layer, while a metal layer is present on at least that portion of the substrate which adjoins said passage, the organic material which forms the walls of the passage being covered by an oxide liner, and a metal being present in said passage.

The invention also relates to a method of manufacturing a semiconductor device, comprising the following steps:
- a metal layer is provided on a substrate comprising silicon,
- a layer comprising at least an organic material is provided on the metal layer,
- a passage is formed in the layer of organic material,
- an oxide liner is deposited by means of a CVD process on the organic material which forms the walls of the passage which are transverse to the substrate, and
- the passage in the organic material is filled with a metal.

Such a device is known from JP-A-10 284 600. In the known device, a layer of organic material is provided on a substrate, in which layer a contact opening and an interconnection groove are provided ("dual damascene structure") by the so-called dual damascene method, which opening and groove are filled with a conductive interconnect material such as Al or Cu. An inorganic protective layer is provided on the walls of organic material of both the contact opening and the interconnection groove. The material of which the protective layer consists is, for example, $SiO_2$. This layer is necessary for preventing the metal from penetrating and damaging the organic material during the deposition in the damascene structure (metallization).

It was found, for example with the use of a damascene structure filled with Cu, that this Cu diffuses into the organic material in the course of time. If Al is used as the interconnect material, the problem arises that the Al reacts with the protective layer, so that it is not very well possible to obtain a uniform filling of the interconnection groove and the contact opening.

The invention has for its object to provide a device of the kind described in the opening paragraph wherein an improved barrier is present between the organic material and the interconnect metal, while at the same time the organic material is protected during the various process steps.

The device according to the invention is for this purpose characterized in that a metal liner comprising Ti or Ta is present between the oxide liner and the metal present in the passage.

The metal liner comprising Ti or Ta prevents the conductive interconnect material with which the damascene structure is filled from diffusing into the organic material. In the case of a Cu metallization, a Ta liner, which serves as a barrier, in particular also ensures a good adhesion of the Cu in the damascene structure. If Al is used as the interconnect material, the metal liner ensures that the damascene structure can be uniformly filled with Al without adverse reactions occurring at the walls of the contact opening and the interconnection groove.

It is noted that the provision of a metal liner comprising Ti or Ta on the walls of the contact opening and the interconnection groove is known per se from U.S. Pat. No. 5,904,565. The object of the method described in this document, however, is to achieve an optimized conduction between the Cu and a subjacent metal surface. There is no question of an organic layer which is to be protected. The combination of a conductive barrier with an oxide liner is not disclosed or even suggested.

An additional advantage is that no pollution of the metal liner comprising Ti or Ta takes place in the device according to the invention. If this liner is directly applied on the organic material, a reaction will occur and the metal liner will be polluted by organic material, with the result that it will have a higher resistance. The deposition of an oxide liner between the metal liner and the organic material solves this problem. The oxide liner also provides a good protection for the organic material during cleaning of the contact surface with the subjacent metal by means of a sputtering etching treatment. This sputtering etching treatment is carried out before the metal liner comprising Ti or Ta is provided.

The method according to the invention is characterized in that the oxide liner is provided by means of low-temperature CVD, and in that a metal liner comprising Ti or Ta is provided on the oxide liner after the provision of this oxide liner.

In JP-A-10 284 600, the oxide liner is provided by means of plasma CVD (Chemical Vapor Deposition, known to those skilled in the art). The use of low-temperature CVD, however, renders it possible to ensure that the thickness of the oxide liner is the same in all locations. This is not possible with the use of plasma CVD.

Figure 2:
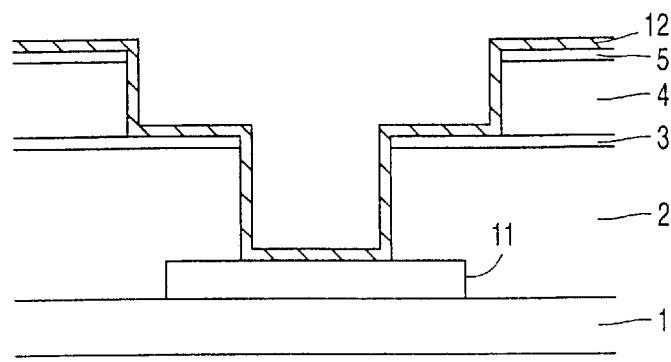
Figure 3:
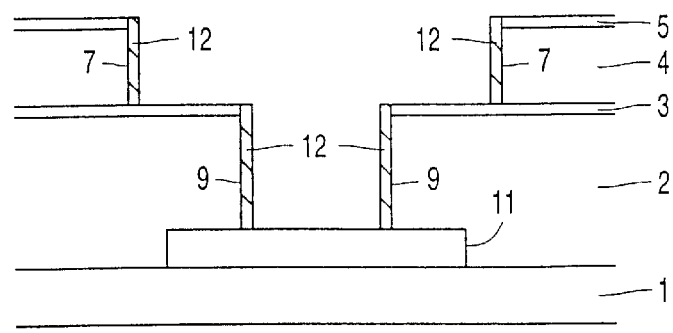
Figure 4:
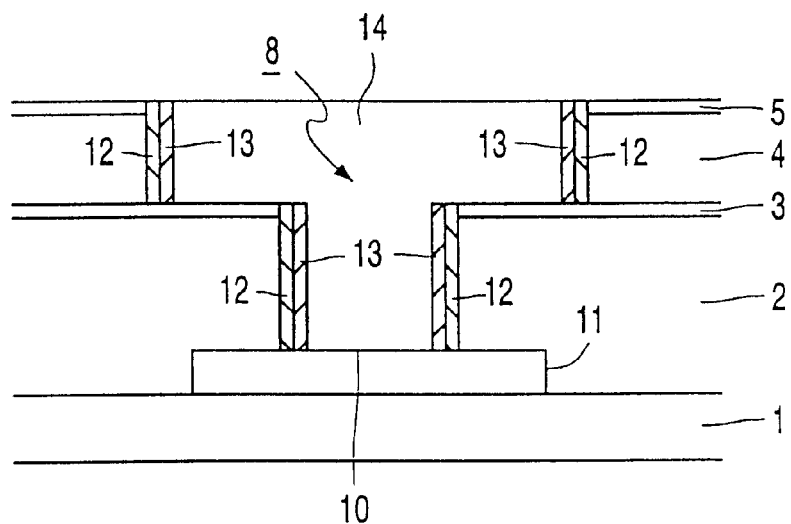
Figure 5:
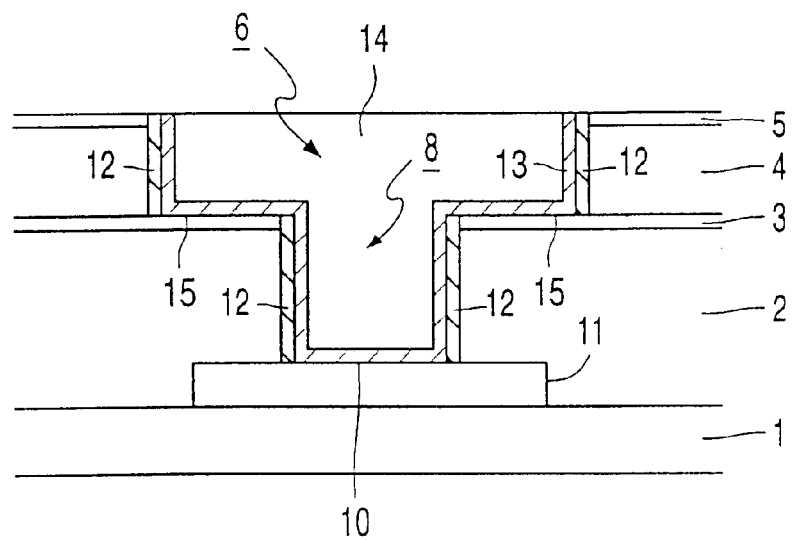

These and other aspects of the invention will be explained in more detail with reference to the drawings, in which FIG. 1 shows an embodiment of the device in cross-section in the phase in which a structure has been provided, FIG. 2 shows the embodiment after an oxide liner has been deposited in the structure of FIG. 1, FIG. 3 shows the embodiment after the removal of the oxide liner from the horizontal surfaces, and FIG. 4 shows the embodiment after the metallization process has been completed, and FIG. 5 4 shows a further embodiment after the metallization process has been completed.

The device of FIG. 1 has a Si substrate 1 with a first layer of organic material 2 thereon. On the first layer of organic material 2 there is a first insulating oxide layer 3 with a second layer of organic material 4 thereon. A second insulating oxide layer 5 is present on top of this second layer of organic material 4. A passage 6, having walls 7 transverse to the layer, is formed in the second oxide layer 5 and the second layer of organic material 4 so as to extend to the first oxide layer 3. A passage 8, having walls 9 transverse to the layer, is furthermore formed in the first oxide layer 3 and the first layer of organic material 2 so as to reach the subjacent substrate 1. A metal layer 11 is present adjoining the bottom 10 of the passage 8 in the first oxide layer 3 and the first layer of organic material 2. The structure thus obtained is known as a "dual damascene" structure. The provision of this structure renders it possible to interconnect two metal layers which lie one above the other in an IC through a direct metal interconnection without any interposed barrier layers. The passage 6 forms an interconnection groove, and the passage 8 forms a contact opening providing contact to the subjacent metal 11.

FIG. 2 shows the next phase in the process, in which an oxide liner 12 is isotropically deposited on the entire structure. The oxide liner is provided by means of low-temperature CVD. Compounds which are highly suitable for this are bi-tert-butylaminosilane, known under the tradename bitbas®:

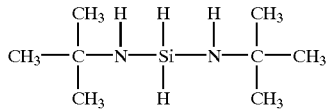

and dimethylchlorosilane:

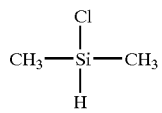

The low-temperature CVD may be carried out at temperatures ≦450° C. at a sufficiently high pressure. The process is a slow one then, so that a uniformly thin liner 12 is obtained. The thickness of the liner 12 is preferably smaller than 10 nm, with a typical value of 5 nm.

In FIG. 3, the oxide liner 12 has been removed by an anisotropic etching treatment which is known per se, so that it is present only on the side walls 7 and 9. The exposed walls 9 and 7 of the first and the second layer of organic material 2 and 4, respectively, are thus entirely covered by the oxide liner 12.

FIG. 4 shows the device in the phase in which the metallization has been completed. After the deposition and etching of the oxide liner 12, the contact surface with its metal layer 11 (the bottom 10 of passage 8) was cleaned in a sputtering etching treatment. Then a metal liner 13 comprising Ti or Ta is provided over the entire structure and is subsequently etched away anisotropically, so that a metal liner 13 remains only on the oxide liner 12 on the side walls 9 and 7 of the first and the second layer of organic material 2 and 4, respectively. Finally, the structure is filled with a conductive interconnect material 14, such as Cu or Al, in a known manner.

FIG. 5 shows a further embodiment of the device, in which a metal liner 13 has not been etched away anisotropically and is accordingly still present on the surfaces 10 and 15 which are substantially parallel to the layers of organic material 2 and 4. These surfaces 10 and 15 are situated in the passages 6 and 8. This embodiment is preferably used in the case of Cu metallization. The liner 13, preferably made of Ta, then acts as a barrier between the interconnect material 14 (Cu) and the organic material 2, 4.

The method according to the invention is not only applicable to the embodiment discussed above. The method according to the invention may be used inter alia in a so-called single damascene structure, which is the same as the structure of FIG. 1, but without a second layer of organic material 4 and a second insulating oxide layer 5. The interposed insulating oxide layers 3 and 5 are not essential to the invention. The substrate 1 on which the metal layer 11 is present may also comprise subjacent metallization structures. In the embodiment discussed above the substrate (1) comprises silicon but the substrate (1) may also comprise another suitable semiconductor material, such as for example GaAs. The substrate (1) may also be formed by a semiconductor layer provided on top of a support of isolating material.

What is claimed is:

1. A method of manufacturing a semiconductor device, comprising the following steps:

a metal layer (11) is provided on a substrate (1)

a layer (2, 4) comprising at least an organic material is provided on the metal layer (11), a passage (6, 8) is formed in the layer (2, 4) of organic material, an oxide liner (12) is deposited by means of a CVD process on the organic material which forms the walls (7, 9) of the passage (6, 8), which walls are transverse to the layer (2, 4), and the passage (6, 8) in the organic material (2,4) is filled with a metal (14), characterized in that the oxide liner (12) is provided by means of low-temperature CVD, and in that a metal liner (13) comprising Ti or Ta is provided on the oxide liner (12) after the provision of this oxide liner (12).

2. A method as claimed in claim 1, characterized in that a substrate (1) is used which comprises silicon.

3. A method as claimed in claim 1 or 2, characterized in that the low-temperature CVD is carried out with bi-tert-butylaminosilane or dimethylchlorosilane.

4. A method as claimed in claim 1 or 2 wherein the metal liner (13) comprising Ti or Ta is also provided on those surfaces (10, 15) lying within the passage (6, 8) which are substantially parallel to the layer (2, 4).

* * * * *